(12) United States Patent
Kelly et al.

(10) Patent No.: US 8,933,832 B2
(45) Date of Patent: Jan. 13, 2015

(54) DIGITAL READOUT METHOD AND APPARATUS

(75) Inventors: Michael Kelly, North Reading, MA (US); Daniel Mooney, Dracut, MA (US); Curtis Colonero, Shrewsbury, MA (US); Robert Berger, Lexington, MA (US); Lawrence Candell, Arlington, MA (US)

(73) Assignee: The Massachusetts Institute of Technology, Cambridge, MA (US)

( * ) Notice: Subject to any disclaimer, the term of this patent is extended or adjusted under 35 U.S.C. 154(b) by 323 days.

(21) Appl. No.: 13/445,433

(22) Filed: Apr. 12, 2012

(65) Prior Publication Data

US 2012/0262322 A1 Oct. 18, 2012

Related U.S. Application Data

(63) Continuation of application No. 11/415,007, filed on May 1, 2006, now Pat. No. 8,179,296.

(60) Provisional application No. 60/722,741, filed on Sep. 30, 2005.

(51) Int. Cl.
    *H03M 1/12* (2006.01)
    *H03M 1/14* (2006.01)
    *H03M 1/60* (2006.01)

(52) U.S. Cl.
    CPC ............... *H03M 1/145* (2013.01); *H03M 1/60* (2013.01)
    USPC .......................................... 341/155; 341/161

(58) Field of Classification Search
    USPC ........ 341/155, 161, 157, 163; 250/214, 208.1
    See application file for complete search history.

(56) References Cited

U.S. PATENT DOCUMENTS

| | | | |
|---|---|---|---|
| 4,475,047 A | 10/1984 | Ebert, Jr. | |
| 4,502,328 A | 3/1985 | Wood et al. | |
| 4,509,118 A | 4/1985 | Shenk | |
| 4,590,583 A | 5/1986 | Miller | |
| 5,461,425 A | 10/1995 | Fowler et al. | |
| 5,583,605 A | 12/1996 | Sakamoto | |
| 5,963,675 A | 10/1999 | van der Wal et al. | |
| 6,160,282 A | 12/2000 | Merrill | |
| 6,348,990 B1 | 2/2002 | Igasaki et al. | |
| 6,380,880 B1 * | 4/2002 | Bidermann | 341/155 |
| 6,400,824 B1 | 6/2002 | Mansoorian et al. | |
| 6,416,017 B1 | 7/2002 | Becker | |
| 6,441,829 B1 | 8/2002 | Blalock et al. | |

(Continued)

FOREIGN PATENT DOCUMENTS

| | | |
|---|---|---|
| AU | 766636 | 5/2000 |
| KR | 10200514722 | 2/2005 |
| WO | WO-93/21624 | 10/1993 |

OTHER PUBLICATIONS

U.S. Office Action for U.S. Appl. No. 13/228,637 mailed Jan. 10, 2013.

(Continued)

*Primary Examiner* — Peguy Jean Pierre
(74) *Attorney, Agent, or Firm* — Cooley LLP

(57) ABSTRACT

Autonomously operating analog to digital converters are formed into a two dimensional array. The array may incorporate digital signal processing functionality. Such an array is particularly well-suited for operation as a readout integrated circuit and, in combination with a sensor array, forms a digital focal plane array.

35 Claims, 8 Drawing Sheets

(56) References Cited

U.S. PATENT DOCUMENTS

| | | | |
|---|---|---|---|
| 6,498,576 B1 | 12/2002 | Tian et al. | |
| 6,518,909 B1 | 2/2003 | Yang et al. | |
| 6,693,575 B1 | 2/2004 | Yang et al. | |
| 6,740,879 B1 | 5/2004 | Tenhet et al. | |
| 6,788,237 B1 | 9/2004 | Bidermann et al. | |
| 6,788,240 B2 | 9/2004 | Reyneri et al. | |
| 6,791,611 B2 | 9/2004 | Yang | |
| 6,809,666 B1 | 10/2004 | Ewedemi et al. | |
| 6,831,684 B1 | 12/2004 | Ewedemi et al. | |
| 6,922,210 B2 | 7/2005 | Yang et al. | |
| 6,970,195 B1 | 11/2005 | Bidermann et al. | |
| 6,975,355 B1 | 12/2005 | Yang et al. | |
| 6,985,181 B2 | 1/2006 | Ewedemi et al. | |
| 7,038,716 B2 | 5/2006 | Klein et al. | |
| 7,061,998 B1 | 6/2006 | Rodgers et al. | |
| 7,315,273 B2 | 1/2008 | Muramatsu et al. | |
| 7,326,903 B2* | 2/2008 | Ackland | 250/208.1 |
| 7,483,058 B1 | 1/2009 | Frank et al. | |
| 7,495,964 B2 | 2/2009 | Taylor et al. | |
| 7,501,627 B1 | 3/2009 | Herr | |
| 7,557,334 B2 | 7/2009 | Lee et al. | |
| 7,623,173 B2 | 11/2009 | Nitta et al. | |
| 7,671,313 B2 | 3/2010 | Watanabe | |
| 8,022,350 B2* | 9/2011 | Ackland | 250/214 SW |
| 8,179,296 B2 | 5/2012 | Kelly et al. | |
| 2004/0047030 A1 | 3/2004 | MacAulay | |
| 2005/0280728 A1 | 12/2005 | Ishikawa et al. | |
| 2006/0097902 A1 | 5/2006 | Muramatsu et al. | |
| 2006/0194624 A1 | 8/2006 | Hsieh et al. | |
| 2006/0243885 A1 | 11/2006 | Watanabe | |
| 2007/0075888 A1 | 4/2007 | Kelly et al. | |
| 2007/0300047 A1 | 12/2007 | Alfano et al. | |
| 2008/0015742 A1 | 1/2008 | Kulyk et al. | |
| 2009/0237534 A1 | 9/2009 | Okumura | |
| 2010/0085458 A1 | 4/2010 | Horiguchi | |
| 2010/0226495 A1 | 9/2010 | Kelly et al. | |
| 2012/0218792 A1 | 8/2012 | Ziegler et al. | |

OTHER PUBLICATIONS

"Revolutionary New Chip Delivers Better Pictures," and "Breakthrough Chip Delivers Better Digital Pictures for Less Power: Tiny cameras could run for years," Digital Photography Review. Available online at http://www.dpreview.com/news/0512/05121201new_chips.asp. Retrieved Sep. 14, 2006.
"ADSP-21msp58/59," Analog Devices: DPS Microcomputers, pp. 1-40 (1995).
"Specifying A/D and D/A Converters," National Semiconductor Application Note 156, pp. 1-6 (Feb. 1976).
"The Medipix1 Chip (PCC)," downloaded from http://medipix.web.cem.ch/MEDIPIX/Medipix1/medipix1.html, Oct. 23, 2001, 2 pgs.
Abouraddy, A.F. et al., "Quantum-optical coherence tomography with dispersion cancellation," Phys. Rev. A 65 053817, 6pp., 2002.
ADSP-21000 Family Application Handbook vol. 1, Analog Devices, Inc., pp. 113-140 (1994).
Allen, L.J. and Oxley, M.P., "Phase retrieval from series of images obtained by defocus variation," Optic Communications, 199:65-75 (Nov. 15, 2001).
Amain Electronics Literature Data Base, http://02f2c2d.netsolhost.com/info.html (Mar. 28, 2006).
Ando, et al. "Ultrafast Correlation Image Sensor: Concept, Deesign, and Applications", 1997 International Conference on Solid-State Sensors and Actuators, Chicago, Jun. 16-19, 1997.
Ando, et., "Correlation Image Sensor: Two-Dimensional Matched Detection of Amplitude-Modulated Light", IEEE Transactions on Electron Devices, vol. 50, No. 10, Oct. 2003.
Arens, E., et al., "Demand Response Enabling Technology Development." UC Berkeley, 108 pp., 2006.
Baron-Nugent, E.D. et al., "Quantitative Phase-Amoitude Microscopy I: Optical Microscopy," Journal of Microscopy, 206(3): 194-203 (Jun. 2002).
Barty, A., et al., "Quantitative Phase Tomography," Optics Communications, 175: 329-336 (Mar. 1, 2000).
Beleggia, M. et al., "On the Transport of Intensity Technique for Phase Retrieval," Ultramicroscopy, 102: 37-49 (2004).
Bermak, A., "A CMOS Imager With PFM/PWM Based Analog-To-Digital Converter," IEEE International Symposium on Circuits and Systems, Aug. 7, 2002 vol. 4, pp. IV-53-IV-56.
Bisogni, et al., "Performance of a 4096 Pixel Photon Countig Chip," SPIE, vol. 3445, pp. 298-304 (Jul. 1998).
Boussald,F., Bermak, A., and Bouzerdoum, A., "A novel ultra-low power reset/read-out technique for megapixels current-mode CMOS imagers," 2003 33rd Conference on European Solid-State Device Research, Sep. 16-18, 2003, pp. 59-62.
Brown, D.: Daniel, B.; Horikiri, T.; King, P.; Nelson, D.; Small, M. "Advances in high-performance sensors for the military and commercial market." Proceedings of SPIE—The International Society for Optical Engineering, v 43692001, p. 419-426.
Brown, M et al., "Digital-pixel Focal Plane Array Development." Proc. of SPIE, vol. 7608, 2010.
Cabanski, W.; Breiter, R.; Koch, R.; Gross, W.; Mauk, K.-H.; Rode, W.; Ziegler, J.; Schneider, H.; Walther, M.; Oelmaier, R. "Third generation focal plane array IR detection modules at AIM." Infrared Physics & Technology, v 43, n 3-5, Oct. 2002, p. 257-63.
Chen, J.C., et al., "Terahertz Detection Using Optical Parametric Upconversion and Geiger Mode Avalanche Photodiodes", Lasers and Electro-Optics, 2008 and 2008 conference on Quantum Electronics and Laser Science. CLEO/QELS 2008.
Cronin-Golomb, et al., "Phase Conjugate Interferometric Measure", Applied Optics, vol. 28, No. 24, Dec. 1989, pp. 5196-5197.
Culurciello, E., "CMOS Image Sensors for Sensor Networks", Analog Integr Circ Sig Process (2006) 49:39-51.
Dahlin, M.; O'Rourke, E. "Advanced focal plane array systems for nextgeneration scanning remote sensing instruments." Proceedings of the SPIE—The International Society for Optical Engineering, v 4820, 2003, p. 406-17.
Dickinson, A., et al, "A 256x256 CMOS active pixel image sensor with motion detection" <http://ericfossum.com/Publications/Papers/A%20256x256%20CMOS%20active%20pixel%20image%20sensor%20with%20motion%20detection.pdf>, 1995 IEEE International Solid State Circuits Conference, Digest of Technical Papers, pp. 226-227, San Francisco, CA, Feb. 1995.
Dickinson, A., Mendis, S.,Inglis. D., Azadet, K. and Fossum, E.R., "CMOS Digital Camera with Parallel Analog to Digital Conversion Architecture" <http://ericfossum.com/Publications/Papers/CMOS%20digital%camera%20with%20parallel%20analog-to-digital%20conversion%20architecture.pdf> , in Program of 1995 IEEE Workshop on CCDs and Advanced Image Sensors, Dana Point, CA, Apr. 20-22, 1995.
Fossum, E.R., "Smart Focal-Plane Technology for MicroInstruments and MicroRovers" (extended abstract) <http://ericfossum.com/Publications/Papers/Smart%20Focal-Plane%20Technology%20for%20Micro-Instruments%20and%20Micro-Rovers.pdf> in Proc. 1992 NASA/OAST Workshop on Microtechnologies and Applications to Space Systems, Pasadena, CA, May 1992.
Graham, R. et. al., "Signal processing on the focal plane array: an overview," Proceedings of SPIE—vol. 4130, Dec. 2000, pp. 237-244.
Guellec, F., et al, "A 253BCm pitch LWIR focal plane array with pixel-level 15-bit ADC providing high well capacity and targeting 2mK NETD," Infrared Technology and Applications XXXVI, Proc. of SPIE vol. 7660, 76603T (2010).
Hamamoto, T., Egi, Y.,Hatori,M., Aizawa, K., Okubo, T.,Maruyama, H. and Fossum, E.R., Computational Image sensors for on-sensor-compression <http://ericfossum.com/Publications/Papers/Computational%20iamge%20sensors%20for%20on%20sensor%20compression.pdf>, Proc. 5th International Conf. on Microelectronics for Neural Networks and Fuzzy Systems (MicroNeuro'96) IEEE Comp. Soc. Press, pp. 297-304 (1996).
John L. Vampola "Chapter 5—Readout electronics for infrared sensors", in David L. Shumaker: The Infrared and Electro-Optical Systems Handbook, vol. 3—Electro-Optical Components. The International Society for Optical Engineering, Jan. 1993.

(56) References Cited

OTHER PUBLICATIONS

Kelly, M., Berger, R., Colonero, C., Gregg, M.,Model, J., Mooney, D., Ringdahl, E., "Design and testing of an all-digital readout integrated circuit for infrared focal plane arrays." Proceedings of SPIE, vol. 5902, 2005, pp. 105-115.

Kelly, M., Colonero,C., Tyrrell, B. and Schultz K., The Digital Focal Plane Array (DFPA) Architecture for Data Processing "On-Chip". MSS Detectors. Feb. 2007.

Kemeny, S.E., Shaw, T.J. Nixon, R.H. and Fossum, E.R., "Parallel processor array for high speed path planning," in Proc. 1992 IEEE Custom Integrated Circuits Conf., pp. P.6.5/1-5, Boston, MA, May 1992.

Kitchen, A., Bermak, A., and Bouzerdoum, A., "A 64°—64 CMOS digital pixel array based on pulse width analogue to digital conversion, with on chip linearising circuit," Proceedings of SPIE, vol. 5274, 2004, p. 163-171.

Kitchen, A., Bermak, A., and Bouzerdoum, A., "PWM digital pixel sensor based on asynchronous self-resetting scheme," IEEE Electron Device Letters, vol. 25, No. 7, pp. 471013473, Jul. 2004.

Kozlowski, L.J., et al., "Progress Toward High-Performance Infrared Imaging Systems-on-a-Chip,"Proceedings of SPIE 4130:245-253 (2000).

Mandi, W., "The Design of a 12 Mega-Pixel Imager With a Nanowatt A/D Converter at Each Pixel," SPIE Proceedings 5074:208-221 (Apr. 2003).

Mandi, W., "Visible Light Imaging Sensor With A/D Conversion at the Pixel," SPIE Proceedings 3649:1-13 (Jan. 1999).

Mandl, W., and Ennulat, Dr. Reinhard, "Space Based Digital LWIR HgCdTe Staring Focal Plane Array Design," SPIE Proceedings 3061:884-894 (Apr. 1997).

Mandl, W., et al., "A LWIR Focal Plane With Digital Readout Demonstrating a Passive Free-Space Optical Readout Link," SPIE Proceedings 3698:736-747 (Apr. 1999.

Mandl, W., et al., "Images and Test Results of MOSAD All digital 640x480 MWIR Prototype Camera," SPIE Proceedings 4131:355-363 (Jul 2000).

Mandl, W., et al., "MOSAD IR Focal Plane Per Pixel A/D Development," SPIE Proceedings 2745:90-98 (Apr. 1996).

Mandl, W., et al., "Stream Vision, A Digital Imaging and Display Technology," SPIE Proceedings 3759:325-337 (Jul. 1999).

Mandolesi, et al., "A Scalable and Programmable Simplicial CNN Digital Pixel Processor Architecture", IEEE Transactions on Circuits and Systems—1: Regular Papers, vol. 51, No. 5, May 2004.

Mandolesi, et al., "A simplicial CNN Visual Processor in 3D SOI-CMOS", ISCAS 2006, John Hopkins University download on Feb. 25, 2009 from IEEE Xplore.

Mansoorian, B., Yee, H-Y., Huang, S. and Fossum, E.R., "A 250 mW, 60 frames/s 1280x720 pixel 9b CMOS digital image sensor" <http://ericfossum.com/Publications/Papers/A%20250%20mW%2060% 20Frames%201280x720%20pixel%209b%20CMOS%20digital% 20image%20sensor.pdf>, in Proc. 1999 IEEE International Solid-State Circuits Conference, pp. 310-311, San Francisco CA Feb. 1999.

Martijn, H.H., et al., "On-Chip Analog to Digital Conversion for Cooled Infrared Detector Arrays," Proceedings of SPIE 4028:183-191 (2000).

McIlrath, L., "Low power, low noise, ultra-wide dynamic range CMOS imager with pixel-parallel A/D conversion," IEEE Symposium on VLSI Circuits, Digest of Technical Papers, 2000, p. 24-27.

Meikonian, L.G., "Dynamic Specifications for Sampling A/D Converters," National Semiconductor Application Note 769:pp. 1-8 (May 1991).

Mendis, S., Kemeny, S. and Fossum, E.R., "A 128x128 CMOS Active Pixel Image Sensor for Highly Integrated Imaging Systems," in International Electron Devices Meeting (IEDM) Technical Digest, pp. 583-586, Washington D.C. Dec. 5-8, 1993.

Mendis, S., Kemeny, S.E.and Fossum.E.R., "CMOS Active Pixel Image Sensor," IEEE Transactions on Electron Devices, vol. 41, No. 3, Mar. 1994.

Nakamura, J., Paln, B.,Nomoto, T., Nakamura, T., and Fossum, E.R., "On-focal plane signal processing for current mode active pixel image sensors" <http://ericfossum.com/Publications/Papers/On%20focal%20plane%20signal%20processing%20for%20current %20mode%20active%20pixel%20image%20sensors%20IEICE. pdf>, in Tech. Rep. of the IEICE (Institute of Electronics, Information and Communications Engineers), EDI97-49, pp. 13-18, (Oct. 1997) in Japanese.

Nasr, M.B., et al., Demonstration of Dispersion-Canceled Quantum-Optical Coherence Tomography Phys. Rev. Lett. 91(8) 083601, 4 pp. 2003.

Notice of Allowance dated Jan. 13, 2012 of U.S. Appl. No. 11/415,007.

Nugent, K.A. et al., "Quantitative Phase Imaging Using Hard X Rays," Physical Review Letters, 77(14): 2961-2964 (Sep. 30, 1996).

Office Action dated Oct. 18, 2010 for U.S. Appl. No. 11/978,351.

Parshall, et al., "Phase-conjugate Interferometric Analysis of Thin Films", Applied Optics, vol. 30, No. 34, Dec. 1991, pp. 5090-5093.

Peizerat, et al., "Pixel-Level A/D Conversion: Companson of Two Charge Packets Counting Techniques," 2007 International Image Sensor Workshop, pp. 200-203 (2007).

Peizerat, et al., "Pixel-Level ADC by Small Charge Quantum Counting," Electronics, Circuits and Systems, ICECS '06, pp. 423-426 (issued Dec. 10-13, 2006; current version Jul. 2, 2007).

Practical Analog Design Techniques, Section 8, Analog Devices (1995).

Rizk, et al., "Flexible Readout and Integration Sensor (FRIS): New Class of Imaging Sensor Arrays Optimized for Air and Missle Defense", Johns Hopkins APL Technical Digest, vol. 28, No. 3 (2010).

Rollins, A.M., et al., "Optimal Interferometer Designs for Optical Coherence Tomography," Optics Lett. 24(21), pp. 1484-1486, 1999.

Schmitt J.M., "Optical Coherence Tomography (Oct.): A Review," IEEE J. Sel. Top. In Quantum Electron, 5, pp. 1205-1215, 1999.

Shapiro, et al., "Imaging with Phase-Sensitive Light," Proceedings of the International Conference quantum Information, Paper IthD1, Jun. 13, 2007, 2 pp.

Shapiro, J.H., "Quantum Gaussian Noise" Proceedings of SPIE 5111, pp. 382-395, 2003.

Shapiro, J.H., et al., "Semiclassical versus quantum behavior in fourth-order interference," J. Opt. Soc. Am. B 11(6), pp. 1130-1141, 1994.

Sorin, W.V., et al., "A Simple Intensity Noise Reduction Technique for Optical Low-Coherence Reflectometry," IEEE Photonics Tech, Lett 4(12), pp. 1404-1406, 1992.

Stobie, J.A.; Hairston, A.W.; Tobin, S.P.; Huppi, RJ.; Huppi, R. "Imaging sensor for the geosynchronous imaging Fourier transform1 spectrometer (GIFTS)." Proceedings of the SPIE—The International Society for Optical Engineering, v 4818, 2002, p. 213-18.

Tadayyon, S., "A Pixel-Level A/D Converter for the Imaging Array of an Advanced Interferometer," Dept. of Electrical Engineering and Computer Science, Massachusetts Institute of Technology, pp. 1-84 (May 7, 1999).

Tearney, G.J., et al., "High-Speed Phase-and group-delay scanning with a grating-based phase control delay line," Optics Lett 22(23) pp. 1811-1813, 1997.

Teaugu, M.R., "Deterministic Phase Retrieval" A Green's Functional Solution, J. Opt. Soc. Am., 73(1): 1434-1441 (Nov. 1983).

Tech Notes, "Digital Focal-Plane Array": Lincoln Laboratory, downloaded from http://222.ll.mit.edu/publications/technotes/ TechNote_DFPA.pdf on Sep. 21, 2010.

The Medipix1 Chip (PCC), downloaded from http://medipix.web. cern.ch/MEDIPIX/Medipix1/medipix1.html, Oct. 23, 2001, 2 pgs.

Tyrrell, B., et al. "Time Delay Integration and In-Pixel Spatiotemporal Filtering Using a Nanoscale Digital CMOS Focal Plane Readout." IEEE Transactions on electron Devices, vol. 58, No. 11, Nov. 2009.

Tyrrell, B., et al., "Design Approaches for Digitally Dominated Active Pixel Sensors: Leveraging Moore's Law Scaling in Focal Plane Readout Design." Proceedings of SPIE, vol. 6900, Feb. 2008.

U. S. Office Action Dated Sep. 15, 2011 in U.S. Appl. No. 11/415,007.

U.S. Office Action dated Oct. 27, 2010 for U.S. Appl. No. 11/415,007.

U.S. Office Action dated Apr. 21, 2011 in U.S. Appl. No. 11/415,007.

(56) References Cited

OTHER PUBLICATIONS

U.S. Office Action dated May 12, 2010 for U.S. Appl. No. 11/415,007.
U.S. Office Action dated Oct. 18, 2010 for U.S. Appl. No. 11/978,351.
US Office Action dated Oct. 27, 2010 for U.S. Appl. No. 11/415,007.
US Office Action DTD Apr. 21, 2011.
US Office Action DTD Sep. 15, 2011.
US Office Action DTD Oct. 18, 2010.
Vampola, John L., (Jan. 1993). "Chapter 5—Readout electronics for infrared sensors", in David L. Shumaker: The Infrared and Electro-Optical Systems Handbook, vol. 3—Electro-Optical Components, The International Society for Optical Engineering.
Waller, L. et al., "Phase from Chromatic Alberrations," Optics Express, 18(22): 22817-22825 (Oct. 13, 2010).
Wojtkowski, M., et al., "Ultrahigh-resolution, high-speed, Fourier domain optical coherence tomography and methods for dispersion compensation," Optics Express 12(11), pp. 2404-2422, 2004.
Yang, D., Fowler, B., El Gamal, A., "128°—128 pixel CMOS area image sensor with multiplexed pixel level A/D conversion," Proceedings of the Custom Integrated Circuits Conference, 1996, pp. 303-306.
Yang, D.X.D., et al., "A Nyquist-Rate Pixel-Level ADC for CMOS Image Sensors," IEEE J. of Solid-State Circuits 34(3):348-356 (Mar. 1999).
Yung, Y. and Bermak, A., "A Digital CMOS Imager with Pixel Level Analog-to-Digital Converter and Reconfigurable SRAM/Counter," Proceedings of the 4th IEEE International Workshop on System-on-Chip for Real-Time Applications (2004).
Zhou, Z., Pain, B., Panicacci, R., Mansoorian, B., Nakamura, J. and Fossum, E.R., "On-focal-plane ADC: Recent progress in on-focal plane ADCs," in Infrared Readout Electronics III, Proc. SPIE vol. 2745, pp. 111-122 Orlando, FL Apr. 1996.
US Office Action on U.S. Appl. No. 13/228,367 mailed May 15, 2013, pp. 1-7.
US Office Action on U.S. Appl. No. 13/299,995 DTD Jun. 17, 2013, pp. 1-26.
Fowler, B., et al., "A CMOS Area Image Sensor With Pixel Level A/D Conversion," Information Systems Laboratory, Electrical Engineering Dept., Stanford University, Stanford, CA., Session Number: TP 13.5, pp. 1-11 (Jun. 21, 2001).
Giacomini, J.D., "High-Performance ADCs Require Dynamic Testing," Application Note AD-02, National Semiconductor Corporation, pp. 1-14 (Aug. 1992).
International Search Report and Written Opinion mailed May 3, 2012, in PCT/US2011/050889.
Kang, S.G., et al., "Infrared Focal Plane Array Readout Integrated Circuit With On-Chip 14 b A/D Converter," Proceedings of SPIE 5234:287-295 (2004).
Kester, W., "High Speed Sampling ADCs," Section 4.
Kleinfelder, S., et al., "A 10 000 Frame/s CMOS Digital Pixel Sensor," IEEE J. of Solid-State Circuits 36(12):2049-2059 (Dec. 2001).
Kleinfelder, S., et al., "A 10kframe/s 0.18µm CMOS Digital Pixel Sensor with Pixel-Level Memory," ISSCC 2001, Session 6 pp. 88-89 and 435-436 (2001).
Kleinfelder, S., et al., "Focal Plane Array Readout Integrated Circuit With Per-Pixel Analog-to-Digital and Digital-to-Analog Conversion," Proceedings of SPIE 4028:139-147 (2000).
Mandl, W., "12 Mega-pixel, 1,000 fps Visible Camera With a Nanowatt A/D Converter at Each Pixel," SPIE Proceedings 5883:1-12 (Aug. 2005).
Mandl, W., "A Photon to Digital Photo Diode Imaging Array," (Apr. 2001).
Mandl, W., "Advances in On Focal Plane A/D With Low Power Optical Readout," SPIE Proceedings 3379:473-482 (Apr. 1998).
Mandl, W., "An Instrument Quality Digital Camera That Transitioned to Low Cost High Volume Production," SPIE Proceedings 4818:230-241 (Jul. 2002).
Mandl, W., "Four Kiloframe, 14 bit, 128X128 Digital Imaging Spectrometer," SPIE Proceedings 4486:385-392 (Aug. 2001).
Mandl, W., "Low Power MWIR Sensor With Pixel A/D Achieves 32 Bit Quantization Level at 30 FPS," SPIE Proceedings, vol. 6206, (Apr. 2006).
Peizerat, A., et al. "An analog counter architecture for pixel-level ADC," 2007 International Image Sensor Workshop, Jun. 7-10, 2007, pp. 200-203.
US Notice of Allowance on 099477-0103 DTD Jan. 13, 2012.

* cited by examiner

DIGITAL READOUT METHOD AND APPARATUS

RELATED APPLICATIONS

This application is a continuation of U.S. application Ser. No. 11/415,007, now U.S. Pat. No. 8,179,296, filed May 1, 2006 entitled "DIGITAL READOUT METHOD AND APPARATUS", which claims the benefit of U.S. Provisional Application Ser. No. 60/722,741, filed Sep. 30, 2005, which applications are incorporated herein by reference in their entireties.

GOVERNMENT SUPPORT

This work was made with government support under contract no. F19628-00-C-0002 awarded by the U.S. Air Force. The Government has Certain rights in this invention.

FIELD OF THE INVENTION

The invention relates to analog to digital converters (ADCs) and, in particular, to collections of ADCs.

BACKGROUND OF THE INVENTION

ADCs are employed in a variety of applications. In particular, high performance focal plan array (FPA) applications require wide-area coverage, high signal-to-noise-ratios (SNR), high spatial resolution, and high frame rates in various combinations. Conventional FPAs are not particular well-suited to satisfy combinations of the above requirements. Conventional FPAs typically provide analog readouts, with the analog signals generated at the pixel level converted to digital signals "off chip." Once converted off-chip, the digital signals may be processed according to the demands of a particular application. Specific analog designs can target (and possibly achieve) one or more requirement, but fail when simultaneously targeting the most aggressive design parameters for imaging applications, such as long-wave infrared imaging (LWIR) applications.

Fundamental limitations on achievable well depth (with concomitant limitations on capacitor size), and the readout noise floor, limit practical scalability of conventional designs. Capacitor size limitations require unnecessarily high frame rates to avoid saturating pixels. Electronics noise and ringing limit the amount of data that can be transmitted on a single output tap to maintain the needed SNR and dynamic range. Attempting to scale conventional analog technology to meet the most demanding requirements leads to a high-power-consumption FPA with many data output taps. This in turn leads to a large, massive, and complex sensor system.

ADCs that are capable of converting a number of signals and a communication structure for manipulating the resulting digital counts in real-time to achieve signal processing functionality, would therefore be highly desirable and may find application in a number of systems, including focal plane arrays.

SUMMARY

An apparatus in accordance with the principles of the present invention includes a two-dimensional array of analog to digital converters (ADCs). In an illustrative embodiment, the ADCs are all self-contained. That is, in such an embodiment, each of the ADCs is capable of operating without signaling, such as an analog ramp signal, or analog reference signal supplied by an outside source. Each of the ADCs within the array may include circuitry to convert a current mode signal to a voltage signal for conversion. In such an embodiment, a capacitor may be employed to integrate charge from the current mode signal and the capacitor and ADC architecture may be selected to determine the least significant bit of each of the ADCs. In such an embodiment, a counter may be employed to determine the most significant bit of each of the ADCs.

An ADC array in accordance with the principles of the present invention may include circuitry that permits the orthogonal transfer of conversion results throughout the array. Such an array may include circuitry that permits the array to convert the plurality of analog signals to digital signals, and then perform digital processing on the resulting digital signals. The processed signals may then be sent, for example, to an analyzer for computation and analysis. In accordance with the principles of the present invention, digital signal processing functions included within the ADC array may include digital filtering, such as spatial or temporal filtering, autonomous digital threshold detection, time-domain filtering, including high-pass or low-pass filtering, and data compression, using, for example, Decimation.

Additionally, an ADC array in accordance with the principles of the present invention may be configured to accept and convert analog signals that are spatially mapped to the arrangement of ADCs within the array. The spatial mapping may be, for example, a one-to-one mapping, with signals arriving at the top left ADC within the array originating at a corresponding location within an array of signals, the signal arriving at the bottom right ADC within the array originating at a corresponding location within an array of signals, and so on. In an integrated circuit embodiment, an entire ADC array may be implemented using a silicon CMOS process, for example.

An ADC array in accordance with the principles of the present invention may be employed as a readout integrated circuit that operates in conjunction with, for example, a photosensor array. In such an embodiment, each of the ADCs within the array may occupy no more area than the area consumed by each of the corresponding photosensors. A readout integrated circuit that employs an ADC array in accordance with the principles of the present invention may be combined with a photosensor array, using hybrid techniques, such as bump-bonding, for example, to form a novel focal plane array.

In an illustrative embodiment an all-digital readout integrated circuit (ROIC) in accordance with the principles of the present invention may be used in conjunction with a cryogenically cooled infrared detector array, with connections between the detector array and the ROIC made via indium bump bonding. The hybrid device thus formed is referred to herein as a digital focal plane array (DFPA). In an illustrative embodiment, the detector array senses incoming optical radiation in the infrared region of the spectrum (2-20 microns) using photodiodes to create currents that are proportional to the optical radiation impinging on the photodiodes. That is, each photodiode (also referred to herein as a pixel) in the detector array produces a current that is proportional to the photon flux impinging upon it. Each photodiode in the array has associated with it a unit cell in the ROIC. The current in each photodiode is collected in the photodiode's associated unit cell within the ROIC. The unit cell electronics integrate the charge and produces, via an analog to digital converter (ADC), a digital number (DN) that is proportional to the total charge accumulated over the frame period. In this illustrative embodiment, the DN for each pixel is then shifted to the edge of the ROIC and multiplexed with other DNs associated with other pixels for transfer off the array. By digitizing the signal while photoelectrons are being collected, rather than after charge accumulation, the need for large charge storage capacitors and highly linear analog electronics can be eliminated. The power dissipation and noise problems associated with a conventional, analog readout, approach are also greatly reduced. Additionally, this approach permits operation with circuitry that operates from a lower level power supply, because the dynamic range requirements associated with conventional systems needn't be maintained. Permitting operation with lower-level power supplies permits the use of Integrated Circuit processes that offer much smaller feature sizes, thereby further enabling the ADC and readout circuitry to be packed within an area less than or equal to the area consumed by the associated detector pitch, also referred to as the pixel pitch. Simplifying the unit cell preamplifier offers considerable power savings for large arrays.

In this illustrative embodiment, the capacitor size defines the least significant bit of the ADC. In this way, the size of the capacitor may be kept to a minimum, thereby significantly reducing the area required for the analog to digital conversion. In this illustrative embodiment, the analog to digital conversion is achieved via a voltage-to-frequency converter in which a predetermined amount of photocurrent charges the capacitor to a level that produces an output pulse and resets the capacitor. The output pulses are counted and the count in a given time period corresponds to the amount of photocurrent and, correspondingly, the light flux impinging on the associated photodiode. In this way, the illustrative embodiment of a DFPA in accordance with the principles of the present invention digitizes the signal while photoelectrons are being collected, rather than after charge accumulation.

A system and method in accordance with the principles of the present invention may be employed to form a DFPA that includes a Nyquist-rate ADC formed wholly within the area of the ADC's associated detector, or pixel pitch. In such an embodiment, each of the ADCs may operate independently of the other ADCs associated with other photodiodes.

An ADC array in accordance with the principles of the present invention may be particularly well-suited for use in an imaging system. In such an implementation, an imaging system might employ an ADC array in accordance with the principles of the present invention in conjunction with a sensor array, such as a photosensor array, to gather and process analog signals. The analog signals subject to processing in such an implementation may represent electromagnetic radiation characterized by any wavelength, and need not be limited to signals that might conventionally be associated with "imaging." That is, in addition to signals that represent photon flux, the signals may, directly, or indirectly, represent chemical or biological content, for example. Such an imaging system may employ an ADC array in accordance with the principles of the present invention to, in addition to converting analog signals to digital, perform digital signal processing operations on the converted signals. Further computations and analysis may be performed by the imaging system on the output of the ADC array. An imaging system in accordance with the principles of the present invention would be particularly suited to use in industrial inspection, surveillance, process control, biological research, chemical research, pharmaceuticals, medical imaging, remote sensing, and astronomy, for example.

A system in accordance with the principles of the present invention integrates a focal plane array with digital readout circuitry. In an illustrative embodiment, the focal plane array includes an array of optical diodes, with each diode defining a pixel. In accordance with the principles of the present invention, circuitry is included in the focal plane array to convert the signal from each diode to a digital signal. Each pixel includes an analog to digital converter (ADC) that is formed within the same area as the photodiode. In an illustrative embodiment, the digital signals produced by the ADCs at each photodiode are routed off-chip. The density of the photodiode array is not limited by the ADC and associated circuitry at each pixel location. Consequently, extremely high-resolution imaging may be achieved by a digital focal plane array (DFPA) in accordance with the principles of the present invention.

An apparatus and method in accordance with the principles of the present invention may also be employed by a DFPA to incorporate on-chip processing to further enhance the DFPA's performance. Such processing may include: digital spatial/temporal filtering that may be implemented by pixel binning whereby image resolution may be traded for dynamic range and/or frame rate; autonomous digital threshold detection that may be used in launch detection or flash detection, for example; time domain digital filtering, such as high-pass or low-pass filtering that may be employed to identify fast- or slow-moving objects; time domain image detection and jitter compensation that, for example, that shifts digital row data synchronously with ground speed and provides image stabilization for field of view jitter; data compression to reduce raw data rate using, for example, decimation; and the use of edge enhancement, such as octonet edge enhancement to aid in feature identification.

A sensor that employs a DFPA in accordance with the principles of the present invention may operate in a variety of modes. In an unmanned aerial vehicle (UAV) application, for example, such a sensor may operate in: a high-resolution day/night panchromatic surveillance mode; a low resolution day/night rapid panchromatic battlefield monitoring, flash/launch detection mode; a low resolution day/night hyperspectral effluence classification and atmospheric condition mode; and a time domain imaging (TDI) mode for "push broom" terrain mapping. An apparatus and method in accordance with the principles of the present invention may be particularly well-suited for use in a large format digital focal plane array (DFPA). Such a DFPA could provide high-resolution wide-area coverage and would thereby find application in air and space intelligence, surveillance, and reconnaissance (ISR). In such an application the DFPA could drastically reduce the number of assets required for global persistent day/night surveillance and launch detection and fully utilize diffraction-limited resolution. The DFPA could also be employed in atmospheric monitoring, providing the ability to detect the initiation of severe weather events on a global scale, thereby lengthening warning times that might allow those in the paths of storms to avoid or ameliorate disaster. A DFPA in accordance with the principles of the present invention may also be used in the detection and identification of chemical agents, for example, in the search for weapons, including weapons of mass destruction. Such detection and identification of chemical agents may also be employed in chemical, medical, or industrial systems in large-scale industrial inspection and massive parallel molecular process monitoring applications.

An ADC array in accordance with the principles of the present invention may incorporate digital signal processing circuitry in the array. In an illustrative embodiment, an array includes an up/down counter at each ADC location and circuitry for the orthogonal shifting of the digital output of each ADC. By controlling the accumulation time, the number and direction of counts, and the number and direction of shifts, the ADC array itself may be employed as an array-wide digital signal processor.

An imaging system that incorporates an ADC array in accordance with the principles of the present invention may be configured to operate, for example, as a camera (in any of a number of electromagnetic bands, including, but not limited to, the visual and infrared) as a surveillance system, as a robotic control system, or as a chemical or biological detection or identification system.

BRIEF DESCRIPTION OF THE DRAWINGS

The above and further features, aspects, and advantages of the invention will be apparent to those skilled in the art from the following detailed description, taken together with the accompanying drawings in which.

DETAILED DESCRIPTION

Figure 1:
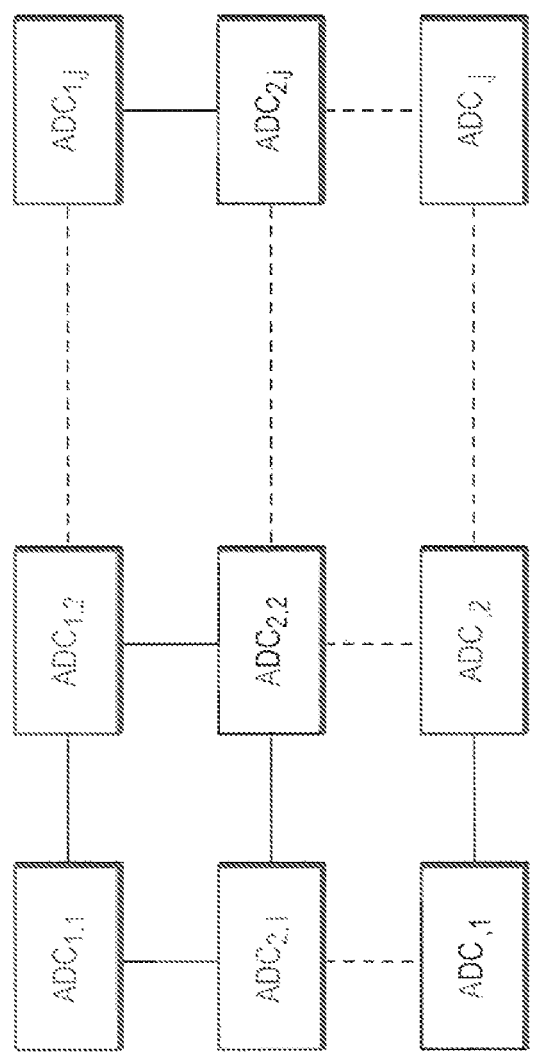
FIG. 1 is a block diagram of a two-dimensional analog to digital converter (ADC) array in accordance with the principles of the present invention.

The block diagram of FIG. 1 illustrates an apparatus in accordance with the principles of the present invention that includes a two-dimensional array 100 of analog to digital converters (ADCs), $ADC_{i,j}$ (where i=1 through n and j=1 through m). In this illustrative embodiment, the ADCs are all self-contained. That is, in such an embodiment, each of the ADCs is capable of operating without signaling, such as an analog ramp signal, or analog reference signal supplied by an outside source. Each of the ADCs within the array may include circuitry to convert a current mode signal to a voltage signal for conversion. In such an embodiment, a capacitor may be employed to integrate charge from the current mode signal and the capacitor and ADC architecture may be selected to determine the least significant bit of each of the ADCs. In such an embodiment, a counter may be employed to determine the most significant bit of each of the ADCs.

Figure 2:
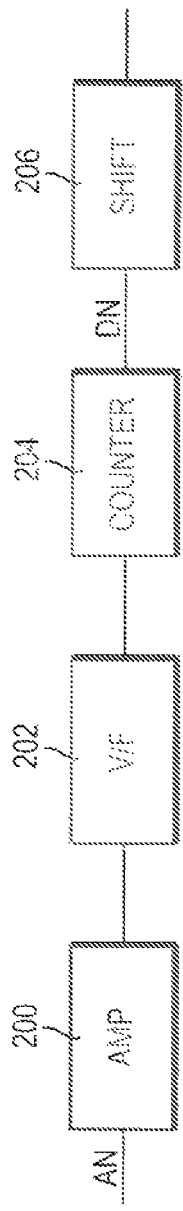
FIG. 2 is a block diagram of an illustrative embodiment of an ADC such as may be employed in an ADC array in accordance with the principles of the present invention.

The block diagram of FIG. 2 provides a more detailed view of an individual ADC, such as may be found employed within an ADC array in accordance with the principles of the present invention. An amplifier 200 (which is optional, depending upon the quality of the signal to be converted) accepts an analog signal, AN, for conversion, amplifies and conditions the signal, AN, and provides the conditioned signal to a voltage to frequency converter 202. In illustrative embodiments the amplifier 200 may be a direct injection, buffered direct injection, source-follower, or transimpedance amplifier, for example. The voltage-to-frequency converter 202 converters the voltage signal from the amplifier to a serial digital signal, the frequency of which is representative of the voltage input. The digital output of the voltage-to-frequency converter is routed to a counter 204, where the digital stream is counted. The resulting count, DN, is a digital signal the magnitude of which is representative of the magnitude of the input analog signal AN. In an illustrative embodiment, the each ADC in the array 100 includes a shift register 206 that may be employed to shift the digital output, DN, to other ADCs within the array 100 and/or outside of the array, for further processing and analysis, for example.

Figure 3:
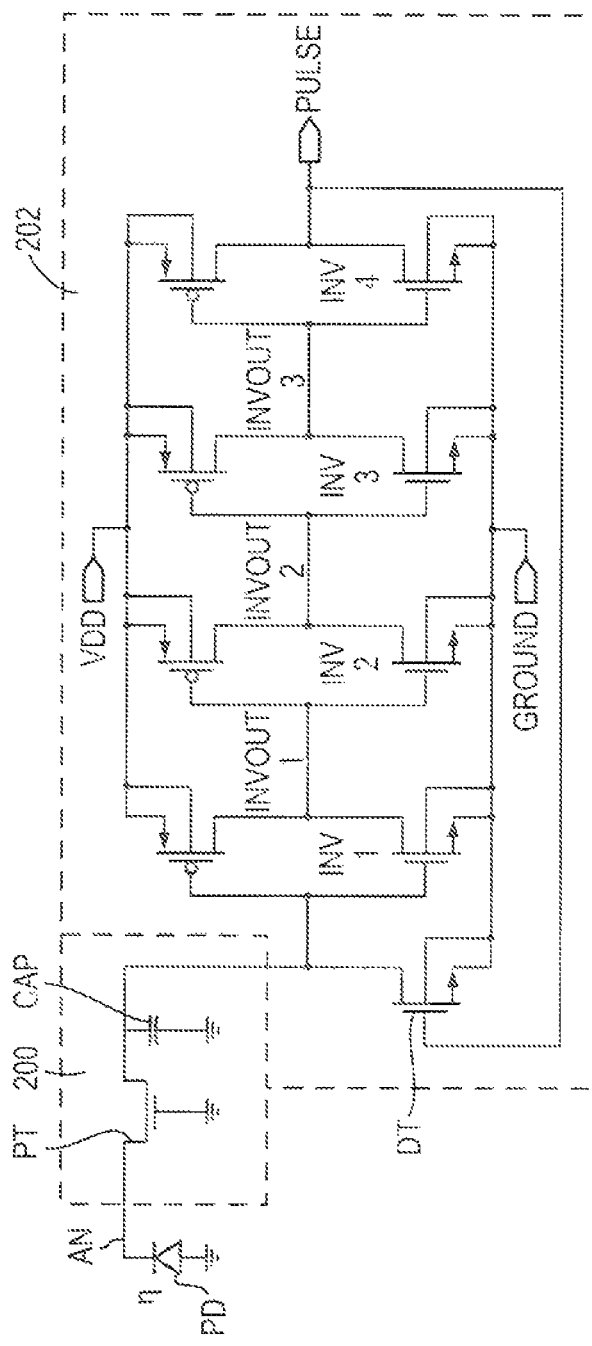
FIG. 3 is a schematic diagram of an illustrative embodiment of a detector in combination with a voltage to frequency converter, such as may be employed by an ADC array in accordance with the principles of the present invention.

The schematic diagram of FIG. 3 provides a more detailed illustration of an amplifier 200 and voltage-to-frequency converter 202, such as may be employed in an ADC array 100 in accordance with the principles of the present invention. Such an embodiment may be used in conjunction with a photo-sensor array to form a readout integrated circuit, or, if the photo-sensor array is also incorporated, a digital focal plane array. In a photo-sensor array embodiment, a photo-sensor would produce a current signal, AN, that is representative of the photon flux impinging upon the photo-sensor. In this illustrative embodiment, a photo-diode PD produces a current in response to electromagnetic radiation impinging upon the photo-diode PN. As is known in the art, various types of photo-sensors may be employed to sense energy of different electromagnetic wavelengths. Current from the photo-diode PD is amplified by the pass transistor PT. The amplified current from the pass transistor is fed to the capacitor, CAP, where the charge is accumulated, thereby increasing the voltage on the capacitor CAP.

The capacitor voltage signal is routed to the voltage to frequency converter 202, at the input to the first of four inverters, INV1, INV2, INV3, and INV4, connected in series. When the voltage on the capacitor CAP reaches the threshold voltage of the inverter INV1, the output state of INV1 switches (from "LOW" to "HIGH" in this illustrative embodiment). The subsequent inverters in the string, INV2 through INV4, also switch and the output, PULSE, switches state (from "LOW" to "HIGH" in this illustrative embodiment). When the signal PULSE goes "HIGH," it turns on the drain transistor, DT, which drains the capacitor, CAP. When the voltage on the capacitor, CAP, is drained below the threshold voltage of the inverter INV1, the inverter INV1, as well as subsequent inverters in the chain (e.g., INV2, INV3, INV4), change state, once again. The result of charging and discharging the capacitor, CAP, is, therefore, in this illustrative embodiment, a positive-going output pulse. As photons continue to impinge upon the photodiode PD, the capacitor will continue to charge to a voltage above the threshold voltage of the inverter INV1, switch the state of the inverters, be discharged by drain transistor DT, and, consequently, produce more output pulses. The rate at which photons impinge upon the photodiode is proportional to the current produced by the photodiode and the rate at which the capacitor, CAP, is charged is also, therefore related to the rate at which photons impinge upon the photodiode PD. The rate at which pulses are produced is proportional to the rate at which the capacitor is charge and, therefore, the pulse rate output is proportional to the rate at which photons impinge upon the photodiode. The inverters INV2 through INV4 also provide pulse-shaping for the output signal, PULSE. In an illustrative embodiment, photocurrent is integrated onto the capacitor, CAP, until the threshold of the first stage inverter INV1 is reached. In this embodiment, the integration capacitor, CAP, is in the single-digit femtofarad range to meet a 10 kHz frame rate requirement with the appropriate input photocurrent. The capacitance value may be achieved, for example, by using the parasitic capacitance of the first inverter gate. In some applications, in the visible range, for example, it may be advantageous to charge the capacitor CAP at a higher rate for a given photo flux. An avalanche photodiode may be employed in order to charge the capacitor at a greater rate for a given photon flux. Additionally, the "effective capacitance" of the capacitor CAP may be reduced, allowing a smaller photon flux to switch the first inverter stage, by discharging a capacitor to a predetermined threshold level. A current mirror with gain can be used as well.

Figure 4:
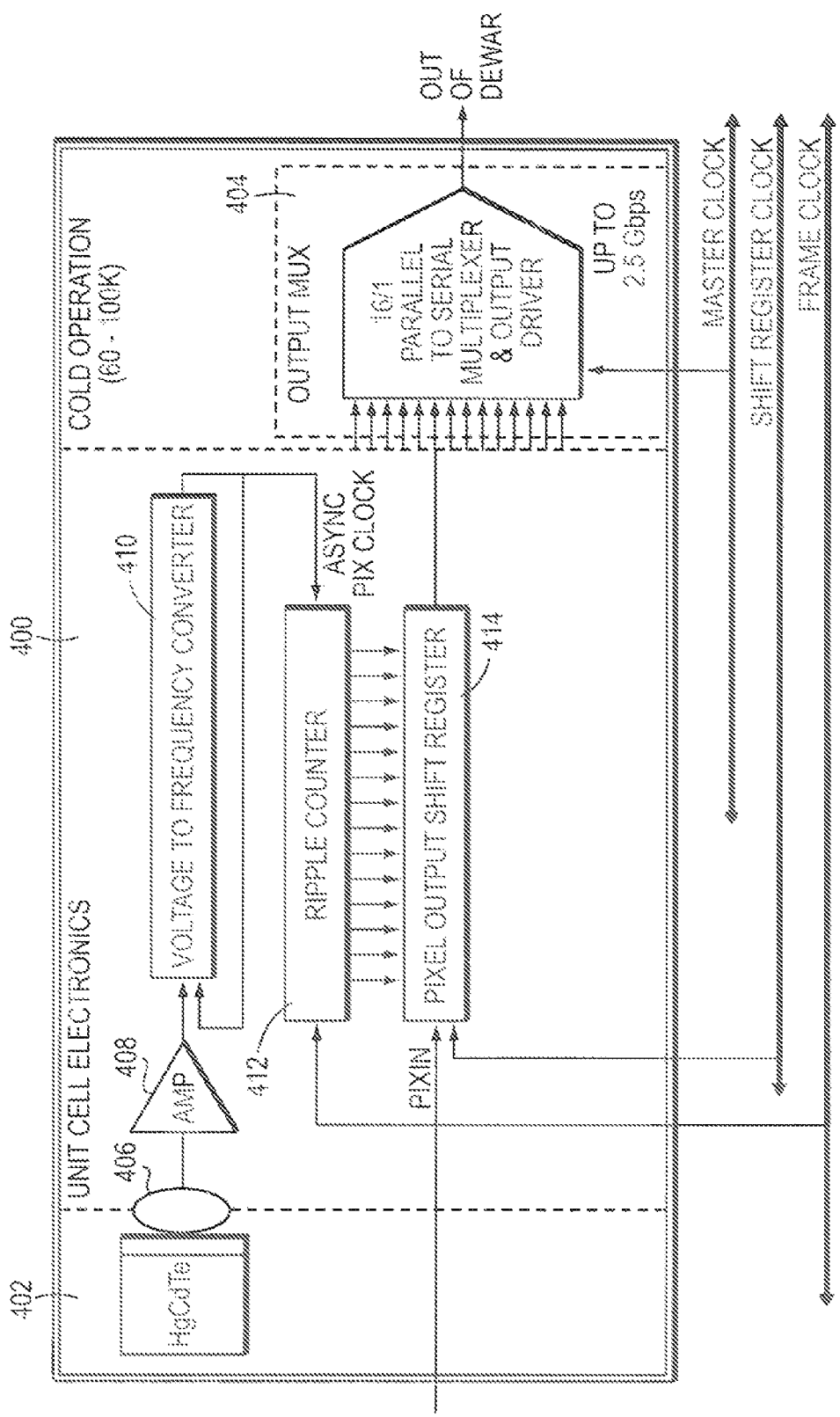
FIG. 4 is a block diagram of an illustrative ADC cell such as may be employed by an ADC array in accordance with the principles of the present invention.

The block diagram of FIG. 4 provides a more detailed view of an ADC 400 and peripheral circuitry, such as may be employed in an array 100 in accordance with the principles of the present invention. In this illustrative embodiment, an HgCdTe photodetector, such as may be employed for sensing electromagnetic radiation in the infrared region of the spectrum, is bonded via bump-bond 406 to the input of the ADC 400. In this embodiment, an output multiplexor 404 is employed to multiplex the results of sixteen rows of ADCs. The input amplifier 408 and voltage-to-frequency converter 410 may be as described in the discussion related to FIG. 3, for example. In this illustrative embodiment, the pulse stream from the voltage to frequency converter 410 is fed to a ripple counter 412, which counts the pulses representative of the input photon flux impinging upon the photodetector 402. The results of the ripple counter may be shifted in parallel into a pixel output register 414, which, in turn may be employed to shift the results out of the array, through the output multiplexor 404, for example. The pixel output shift register 414 may also receive the output of other ADCs through the PIXIN input to the shift register 414. In this way, the count results from a row of ADCs may be shifted out through the output mutliplexor 404.

An ADC array 100 may be employed, for example, in high performance long-wave infrared (LWIR) imaging applications that demand wide area coverage, high SNR, and high spatial resolution. In such an embodiment, a sensor array equipped with a large format, cryogenically cooled Hg1-xCdxTe focal plane array (FPA) with small pixels would supply analog current-mode signals to corresponding ADCs within the ADC array 100. The minimum useful pixel size in such a sensor array will ultimately be driven by the optical system. Advanced spectral sensors also demand very high frame rates to collect hundreds of channels in a short period of time. As previously described, conventional (analog) FPAs are not well suited to meet all of these requirements. Specific analog designs can target (and possibly achieve) one or more requirement, but fail when simultaneously targeting the most aggressive design parameters for LWIR applications. Fundamental limitations on achievable well depth (capacitor size) and the readout noise floor limit practical scalability of conventional designs. Capacitor size limitations require unnecessarily high frame rates to avoid saturating pixels. Electronics noise and ringing limit the amount of data that can be transmitted on a single output tap to maintain the needed SNR and dynamic range. Attempting to scale conventional analog technology to meet the most demanding requirements leads to a high-power FPA with many data output taps. This in turn leads to a large, massive, and complex sensor system. A digital focal plane array that employs an ADC array in accordance with the principles of the present invention may exploit commercially available, low voltage, and deeply scaled submicron CMOS processes, and, thereby, significantly reduce costs, in addition to providing superior performance. In an illustrative embodiment, such as described in the discussion related to FIG. 3, the charge accumulation capacitor, CAP, effectively defines the magnitude of the least significant bit of the ADC and the analog signal is digitized "on the fly," as photoelectrons generate charge, rather than waiting for charge accumulate on a large capacitor which would define the full-scale value of the ADC. By digitizing the signal while photoelectrons are being collected, rather than after charge accumulation, the need for large charge storage capacitors and highly linear analog electronics is eliminated. The power dissipation and noise problems associated with the analog readout approach are also greatly reduced.

That is, for example, in a conventional, LWIR analog, focal plane array a Hg1-xCdxTe photodiode array may be mated to a Silicon (Si) readout integrated circuit (ROIC). Photons absorbed within the active region of the photodiode detector are converted to electrons, producing a photocurrent. A conventional FPA integrates the current during a frame period onto a large capacitor, producing an analog voltage. The voltage produced on each capacitor, within each pixel, is proportional to the light intensity incident on the pixel. At the end of a frame period, one of several possible methods is used to transfer the voltage value for each pixel to an analog multiplexer and output driver and the capacitor is reset. Off-chip electronics condition the resulting analog date stream for quantization by an A/D converter. In this architecture, the capacitor size determines the most significant bit (MSB), and the off-chip electronics determine the least significant bit (LSB) of the sensor.

In a digital focal plane array that employs an ADC array in accordance with the principles of the present invention, the photocurrent drives a voltage-to-frequency (V/F) converter. The input of the V/F converter consists of a very small capacitor, which integrates the photocurrent. When the voltage reaches a pre-defined threshold level, a counter within the pixel is incremented and the capacitor is reset. The counter is incrementally increased throughout the entire frame period. No additional off-chip electronics are needed. At the end of a frame period, the digital counts for each pixel are transferred to a digital multiplexer and output driver for readout. In this architecture, the counter size determines the MSB and the capacitor size determines the LSB of the sensor. As previously described, a constituent ADC includes a pre-amplifier 408, voltage-to-frequency converter 410, sequential or non-sequential counter 412, and shift register 414. The shift register 414 may be employed for "snapshot" imaging in high background applications. Shift registers 414 may be serially connected to adjacent ADCs in each row to read out data bits. In snapshot mode, counters 412 within each ADC in the array 100 can operate while data from the previous frame is read from the array 100. In low background, long integration applications, the ripple counter 412 can be configured to count or shift values to adjacent pixels. In this configuration, the readout operates in a burst mode with little loss of signal. Significant reduction in ADC area can be achieved when the readout can operate in burst mode. In this illustrative embodiment, a ripple counter configuration was chosen over a synchronous counter because of its lower power consumption; every bit of a synchronous counter would be clocked at every V/F converter pulse. A ripple counter only clocks an average of two bits per pulse. The dynamic D flip-flop structures were built using true-single phase clock (TSPC) logic. Other dynamic D flip-flop designs may be employed, although they will, typically, consume more area. Using this design structure, one may implement the design using 12 transistors per register cell, making layout of an area-constrained design feasible. The three logic control lines handle the reset of the ripple counter, the load of the shift registers, and the clocking of the shift registers to output the data from the previous integration period.

As previously described, photocurrent from a detector, such as detector 402, drives the voltage-to-frequency converter through a preamplifier 408. A wide variety of preamplification techniques are compatible with an ADC array in accordance with the principles of the present invention (and readout integrated circuit and digital focal plane array that employ such an ADC array). Since the preamp is reset on each LSB, linearity is not a major issue as long as it is stable. In this illustrative embodiment, the voltage-to-frequency converter produces a pulse stream that is used as an asynchronous clock to drive the counter. At the end of a frame period, the digital number in the counter 412 is transferred to the shift register 414 and then to a 16:1 digital multiplexer 404 located at the edge of the unit cell array. In this illustrative embodiment, the multiplexer maximum output data rate (2.5 Gbps) was chosen for compatibility with off-the-shelf receiving electronics.

The signal to noise ratio achievable with a digital focal plane array in accordance with the principles of the present invention can be calculated from Eq. 1. The effective number of bits (ENOB) is a convenient figure of merit for comparing the digital focal plane array performance to existing sensor systems and commercial ADC products. The ENOB describes the SNR of the system, under stated sampling conditions, relative to the quantization noise of an ideal A/D converter. The ENOB specification for a real A/D converter is always lower than the maximum bit depth.

$$SNR = \frac{1}{\sqrt{\frac{1}{12N^2} + \frac{1}{NC^2V^2}\left[CVq + kTC + \frac{e_n^2}{R_d^2}\frac{t}{2N}\right]}} \quad \text{Eq. 1}$$

$$ENOB = \log_2(SNR) - 1.79 \quad \text{Eq. 2}$$

Where N is the decimal count value read-out from the pixel, C is the effective input capacitance into the V/F converter, V is the threshold voltage of the V/F converter, q is the electronic charge unit, k is Boltzmann's constant, T is the temperature, $e_n$ is the input referred voltage noise density of the preamp, $R_d$ is the detector shunt resistance, and t is the frame integration time. The model considers quantization, kTC (associated with resting a capacitor), preamp, and shot noise.

Figure 5:
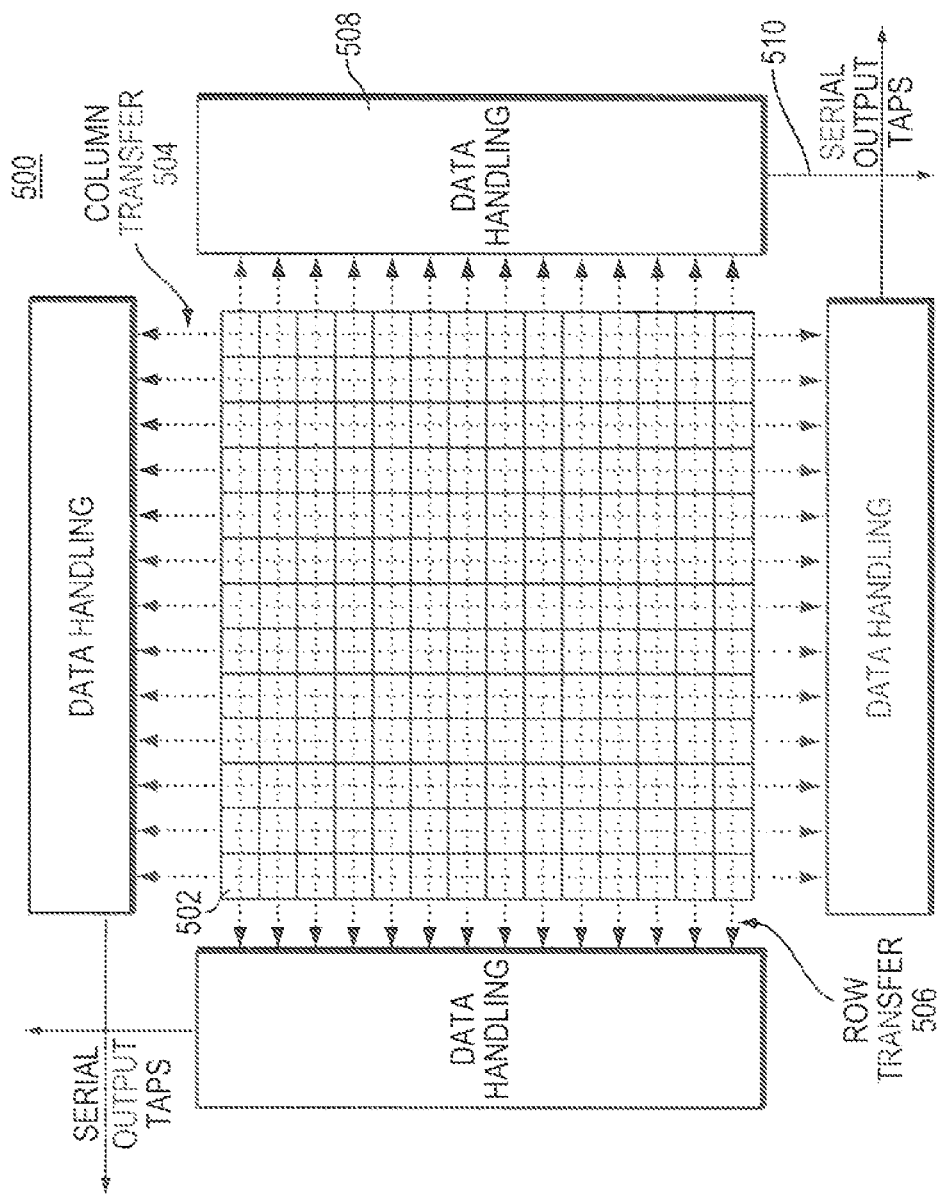
FIG. 5 is a schematic diagram that illustrates the interconnection paths of ADC within an ADC array in accordance with the principles of the present invention.

As illustrated in the block diagram of FIG. 5, an ADC array 500 in accordance with the principles of the present invention may include circuitry that permits the orthogonal transfer of conversion results throughout the array. Each block within the illustrative array, such as block 502, represents an ADC. Digital results from each ADC may be transferred through a column transfer 504 and/or through a row transfer 506. In this manner, any result from any ADC within the array 500 may be transferred to any other ADC within the array 500; such transfer capability is what is referred to herein as orthogonal transfer. Such an orthogonal transfer capability provides an element of digital signal processing operation to the array 500 that permits the array to convert a plurality of analog signals to digital signals, then perform digital processing on the resulting digital signals. Data-handling circuitry 508 may be configured to provide additional data operations on the digital results of ADCs within the array 500. Serial output taps 510 may be employed to send the processed signals, for example, to an analyzer for computation and analysis. The analyzer may take the form of a core microprocessor, a microcontroller, or a general purpose or special function computer, for example.

Figure 6:
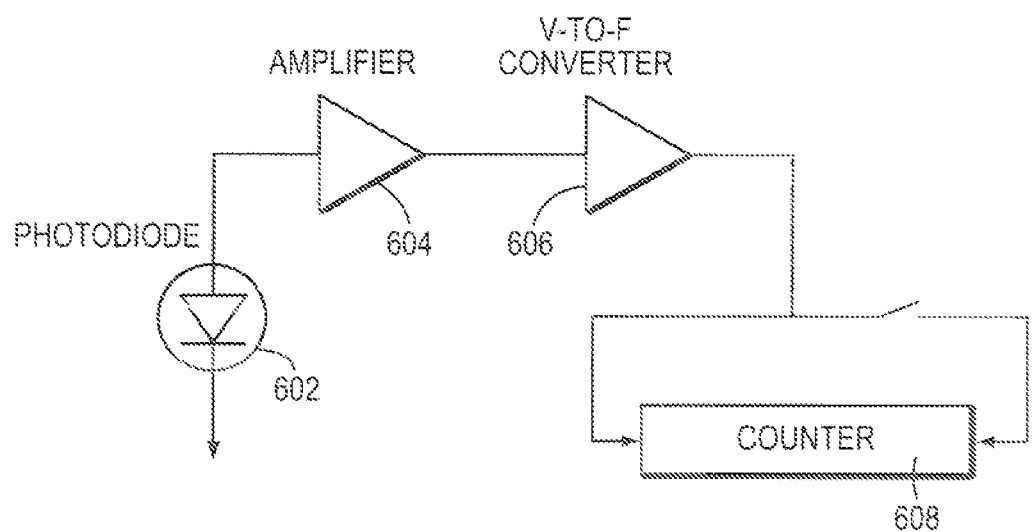
FIG. 6 is a block diagram of an ADC such as may be incorporated in an ADC array in accordance with the principles of the present invention.

The block diagram of FIG. 6 illustrates an ADC implementation 600 such as may be employed within each of the cells 502 of an ADC array 500 in accordance with the principles of the present invention. In this illustrative embodiment, a photodiode 602 generates a current in response to impinging electromagnetic radiation. An amplifier 604, which may be, as previously described, a direct injection, buffered direct injection, source-follower, or transimpedance amplifier, amplifies the photocurrent produced by the photodiode. A voltage to frequency converter 606 converts the signal to a digital frequency signal, and a counter 608 counts the digital frequency signal. In this illustrative embodiment, the counter 608 is an up/down counter. The combination of orthogonal transfer capability, up/down counting, and the ability to select integration times (for example, simply by reading the ADC results at intervals of interest) provides the elementary functions required for digital signal processing. By controlling the accumulation time, the number and direction of counts, and the number and direction of shifts, the ADC array itself may be employed as an array-wide digital signal processor.

Using these elementary operations, digital signal processing functions included within the ADC array may include digital filtering, such as spatial or temporal filtering, autonomous digital threshold detection, time-domain filtering, including high-pass or low-pass filtering, and data compression, using, for example, Decimation. In an illustrative embodiment, the up/down counter 608 is a linear feedback shift register that is configured to perform both counting and data transfer operations. The linear feedback shift register is configured to either increment or decrement the sequence provided by the voltage to frequency converter within the same cell, or shifted into the cell from another ADC cell under control of signal that may be provided locally ("on-chip" in a single integrated circuit implementation) or remotely ("off-chip," which could be, for example, on an accompanying controller in a hybrid implementation, for example).

In an illustrative embodiment, an ADC array in accordance with the principles of the present invention may be configured to accept and convert analog signals that are spatially mapped to the arrangement of ADCs within the array. The spatial mapping may be, for example, a one-to-one mapping, with signals arriving at the top left ADC within the array originating at a corresponding location within an array of signals, the signal arriving at the bottom right ADC within the array originating at a corresponding location within an array of signals, and so on. In an integrated circuit embodiment, an entire ADC array may be implemented using a silicon CMOS process, for example. A digital focal plane array in accordance with the principles of the present invention, one that employs an ADC array in accordance with the principles of the present invention, may be a monolithic integrated circuit device, with detectors and readout integrated circuit formed in a single device, or it may be implemented as hybrid device, with the array of amplifiers, voltage to frequency converters, and counters all implemented in a single integrated circuit (using Silicon CMOS technology, for example) and mated, with a photodetector array using, for example, bump bonding. In such an illustrative embodiment, one in which an ADC array in accordance with the principles of the present invention is employed as a readout integrated circuit that operates in conjunction with a photosensor array, each of the ADCs within the array may occupy no more area than the area consumed by each of the corresponding photosensors.

In an illustrative embodiment an all-digital readout integrated circuit in accordance with the principles of the present invention may be used in conjunction with a cryogenically cooled infrared detector array, with connections between the detector array and the ROIC made via indium bump bonding. The hybrid device thus formed is referred to herein as a digital focal plane array. In an illustrative embodiment, the detector array senses incoming optical radiation in the infrared region of the spectrum (2-20 microns) using photodiodes to create currents that are proportional to the optical radiation impinging on the photodiodes. That is, each photodiode (also referred to herein as a pixel) in the detector array produces a current that is proportional to the photon flux impinging upon it. Each photodiode in the array has associated with it a unit cell in the ROIC. The current in each photodiode is collected in the photodiode's associated unit cell within the ROIC. The unit cell electronics integrate the charge and produces, via an analog to digital converter (ADC), a digital number (DN) that is proportional to the total charge accumulated over the frame period. In this illustrative embodiment, the DN for each pixel is then shifted to the edge of the ROIC and multiplexed with other DNs associated with other pixels for serial transfer off the array. By digitizing the signal while photoelectrons are being collected, rather than after charge accumulation, the need for large charge storage capacitors and highly linear analog electronics can be eliminated. The power dissipation and noise problems associated with a conventional, analog readout, approach are also greatly reduced. Additionally, this approach permits operation with circuitry that operates from a lower level power supply, because the dynamic range requirements associated with conventional systems needn't be maintained. Permitting operation with lower-level power supplies permits the use of Integrated Circuit processes that offer much smaller feature sizes, thereby further enabling the ADC and readout circuitry to be packed within an area less than or equal to the area consumed by the associated photodiode. Simplifying the unit cell preamplifier offers considerable power savings for large arrays.

In this illustrative embodiment, the capacitor is sized to define the least significant bit of the ADC. In this way, the size of the capacitor may be kept to a minimum, thereby significantly reducing the area required for the analog to digital conversion. In this illustrative embodiment, the analog to digital conversion is achieved via a voltage-to-frequency converter in which a predetermined amount of photocurrent charges the capacitor to a level that produces an output pulse and resets the capacitor. The output pulses are counted and the count in a given time period corresponds to the amount of photocurrent and, correspondingly, the light flux impinging on the associated photodiode. In this way, the illustrative embodiment of a DFPA in accordance with the principles of the present invention, digitizes the signal while photoelectrons are being collected, rather than after charge accumulation.

A system and method in accordance with the principles of the present invention may be employed to form a DFPA that includes a Nyquist-rate ADC formed wholly within the area of the ADC's associated detector or, pixel, pitch. In such and embodiment, each of the ADCs may operate independently of the other ADCs associated with other photodiodes.

Figure 7A:
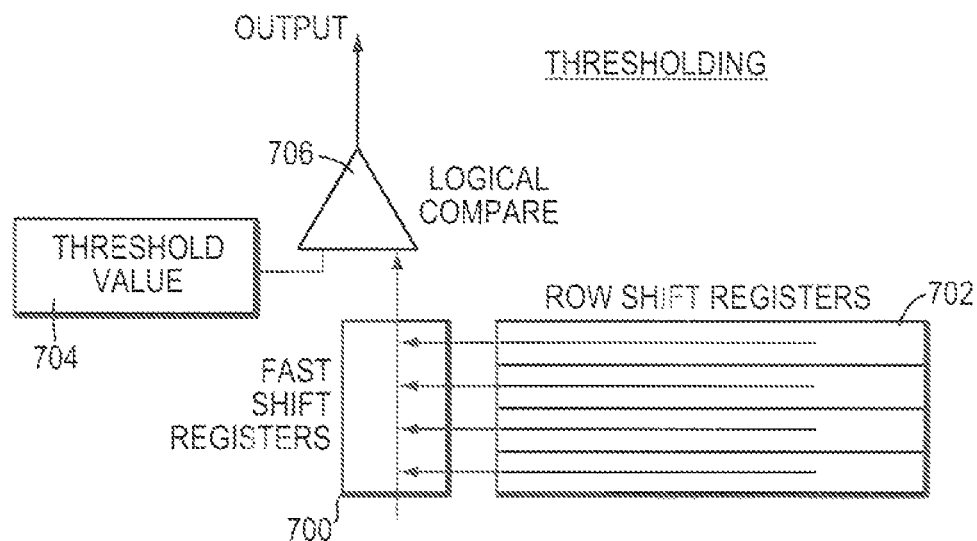
FIGS. 7A and 7B are block diagrams of data handling blocks such as may be employed in an ADC array in accordance with the principles of the present invention.
Figure 7B:
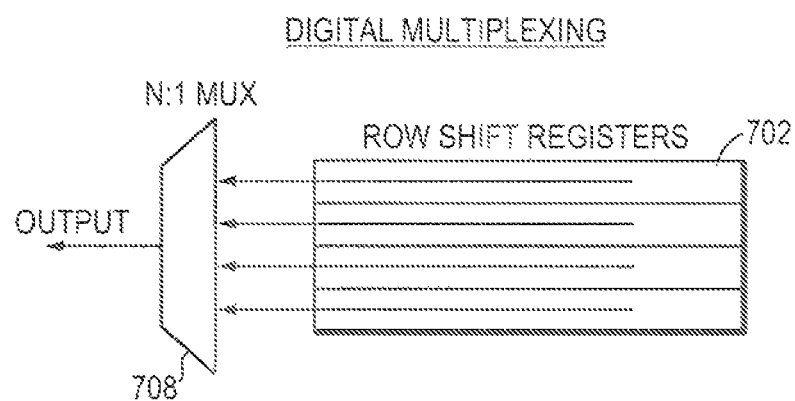

The block diagrams of FIGS. 7A and 7B provide a more detailed illustration of data handling structures, such as structures 508 of FIG. 5, in accordance with the principles of the present invention. In FIG. 7A a fast shift register 700 may be employed to burst data at a high rate as the data is fed into the fast shift register 700 from slower row shift registers 702. In accordance with the principles of the present invention, the data handling structures may also perform various logic operations may on the data. Logic operations may be used, for example, for thresholding data and match filtering. Power consumption and data transmission off-array may be greatly reduced by employing a threshold digital value 704, comparing 706 data from the fast shift register 700 to the threshold value, and transmitting only values that meet the comparison requirements (for example, greater than, less than, or equal to). As illustrated in the block diagram of FIG. 7B, a parallel to serial multiplexor 708 may be employed to serialize the low-rate data to a high-rate output tap.

Figure 8:
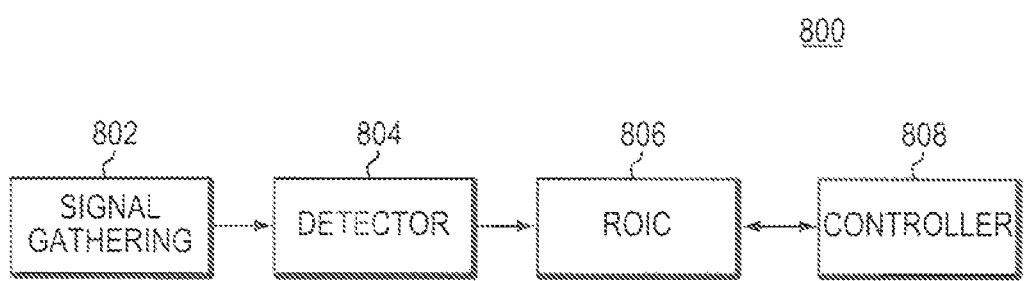
FIG. 8 is a block diagram of and imaging system in accordance with the principles of the present invention.

An ADC array in accordance with the principles of the present invention may be particularly well-suited for use in an imaging system. The block diagram of FIG. 8 illustrates the components of an imaging system 800 in accordance with the principles of the present invention. In this illustrated embodiment, a signal gathering mechanism 802 feeds analog signals to a detector array 804. In an optical imaging embodiment, the signal gathering mechanism 802 may include optical elements, such as lenses and the detector array may include an array of photodiodes, for example. In chemical detection or analysis system, or biological detect or analysis systems the signal gathering and detector systems may be optical filter-, dispersive element-, or interferometer-based spectrometers. The illustrative imaging system 800 employs an ADC array in accordance with the principles of the present invention in the readout integrated circuit 806 in conjunction with the sensor array 804, to gather and process analog signals. The analog signals subject to processing in such an implementation may represent electromagnetic radiation characterized by any wavelength, and need not be limited to signals that might conventionally be associated with "imaging." That is, in addition to signals that represent phonon flux, the signals may, directly, or indirectly, represent chemical or biological content, for example. Such an imaging system may employ an ADC array in accordance with the principles of the present invention to, in addition to converting analog signals to digital signals, perform digital signal processing operations on the converted signals. Further computations and analysis may be performed by the imaging system controller 808 on the output of the ADC array. The controller 808 may also be referred to herein as an analyzer.

The controller 808 may be implemented in a variety of ways and may take the form of a single-chip microcontroller, a mainframe computer, or anything in between. The controller may be configured to initiate the transfer of digital signals from the readout integrated circuit 806 and to control the shifts, counts, and accumulation times that permit a readout integrated circuit in accordance with the principles of the present invention to perform digital signal processing functions on-chip. Control functions may also be incorporated in a readout integrated circuit in accordance with the principles of the present invention, or in a hybrid implementation. Such an integration would permit the ADC array to operate autonomously and to perform on chip-DSP functions relatively free of external control. An imaging system 800 in accordance with the principles of the present invention would be particularly suited to use in industrial inspection, surveillance, process control, biological research, chemical research, pharmaceuticals, medical imaging, remote sensing, and astronomy, for example. A compact implementation, using a single-chip readout integrated circuit in conjunction with camera controller would be particularly well-suited to operation within a variety of cameras, including portable consumer still and motion cameras, for example. As previously described, the density of the sensor (e.g., photodiode) array is not limited by the ADC and associated circuitry at each pixel location. Consequently, extremely high-resolution imaging may be achieved by a digital focal plane array in accordance with the principles of the present invention.

As previously described, an ADC array in accordance with the principles of the present invention may be employed by a digital focal plane array to incorporate on-chip processing to further enhance the digital focal plane array's performance and, by extension, the performance of an imaging system 800. Such processing may include: digital spatial/temporal filtering that may be implemented by pixel binning whereby image resolution may be traded for dynamic range and/or frame rate; autonomous digital threshold detection that may be used in launch detection or flash detection, for example; time domain digital filtering, such as high-pass or low-pass filtering that may be employed to identify fast- or slow-moving objects; time domain image detection and jitter compensation that, for example, that shifts digital row data synchronously the camera line of sight (LOS) and provides image stabilization for field of view jitter; data compression to reduce raw data rate using, for example, decimation; and the use of edge enhancement, such as octonet edge enhancement to aid in feature identification.

A imaging system 800 that employs a digital focal plane array in accordance with the principles of the present invention may operate in a variety of modes. In an unmanned aerial vehicle (UAV) application, for example, such a sensor may operate in: a high-resolution day/night panchromatic surveillance mode; a low resolution day/night rapid panchromatic battlefield monitoring, flash/launch detection mode; a low resolution day/night hyper-spectral effluence classification and atmospheric condition mode; and a time domain imaging (TDI) mode for "push broom" terrain mapping. An apparatus and method in accordance with the principles of the present invention may be particularly well-suited for use in a large format digital focal plane array (DFPA). Such a DFPA could provide high-resolution wide-area coverage and would thereby find application in air and space intelligence, surveillance, and reconnaissance (ISR). In such an application the DFPA could drastically reduce the number of assets required for global persistent day/night surveillance and launch detection and fully utilize diffraction-limited resolution. The DFPA could also be employed in atmospheric monitoring, providing the ability to detect the initiation of severe weather events on a global scale, thereby lengthening warning times that might allow those in the paths of storms to avoid or ameliorate disaster. A digital focal plane array in accordance with the principles of the present invention may also be used in the detection and identification of chemical agents, for example, in the search for weapons, including weapons of mass destruction. Such detection and identification of chemical agents may also be employed in chemical, medical, or industrial systems in large-scale industrial inspection and massive parallel molecular process monitoring applications. An imaging system 800 that incorporates an ADC array in accordance with the principles of the present invention may be configured to operate, for example, as a camera (in any of a number of electromagnetic bands, including, but not limited to, the visual and infrared) as a surveillance system, as a robotic control system, or as a chemical or biological detection or identification system.

Figure 9:
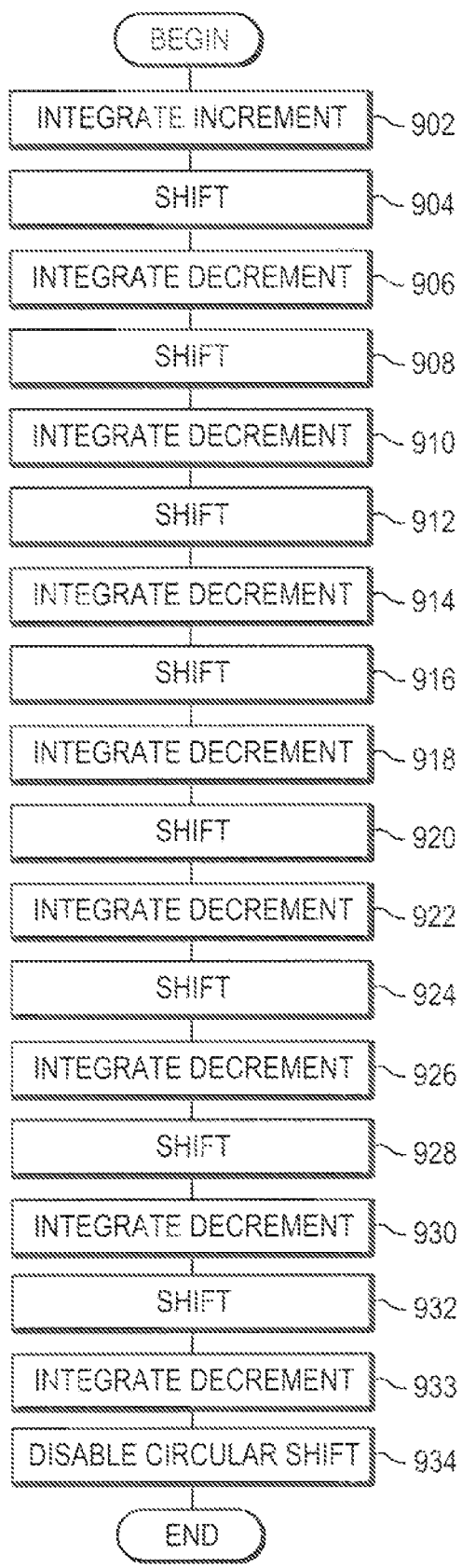
FIG. 9 is a flow chart of an illustrative digital signal processing operation such as may be executed by an ADC array in accordance with the principles of the present invention.

The flow chart of FIG. 9 provides an illustration of the process whereby a ADC array in accordance with the principles of the present invention provides signal processing functions on-chip. By utilizing the previously described orthogonal transfer and bi-directional counting features of the array, many digital signal processing algorithms may be implemented directly on the array (on an imaging chip in a digital focal plane array embodiment) prior to reading any data out of the array. Conventional focal plane arrays must read all data out of the array and provide the data to a processing unit (also referred to herein as a controller) to perform image processing task. In the example of FIG. 9, an ADC array in accordance with the principles of the present invention performs a convolution operation. This can be accomplished by manipulating the integration time, count shift position on the array, and ADC counting direction. The sign is controlled by the count direction. The extent of the convolution kernel is defined by the number and direction of transfers between each integration period. The following kernel can be implemented by following the steps of the flow chart of FIG. 9.

| The Kernel: | | |
|---|---|---|
| −1 | −1 | −1 |
| −1 | 8 | −1 |
| −1 | −1 | −1 |

The process begins in step 900 and proceeds from there to step 902 where the photocurrent is integrated for eight time units and each counter in the ADC array is incremented by the number of counts corresponding to the photocurrent that is integrated during the eight time units. From there the process proceeds to step 904, where all array count values are shifted to the left one pixel. Circular shifting at the edge of the array is optional. In step 906 the photocurrent is integrated for one time unit and the counters are decremented by the number of counts corresponding to the photocurrent that is integrated during the one time unit. In step 908 all array count values are shifted up one pixel (that is, a column shift to the nearest neighboring ADC "above"). In step 910 the photocurrent is integrated for one time unit and the counters are decremented by the number of counts corresponding to the photocurrent that is integrated during the one time unit. In step 912 all array count values are shifted to the right one pixel. In step 914 the photocurrent is integrated for one time unit and the counters are decremented by the number of counts corresponding to the photocurrent that is integrated during the one time unit. In step 916 all array count values are shifted to the right one pixel. In step 918 the photocurrent is integrated for one time unit and the counters are decremented by the number of counts corresponding to the photocurrent that is integrated during the one time unit. In step 920 all array count values are shifted down one pixel. In step 922 the photocurrent is integrated for one time unit and the counters are decremented by the number of counts corresponding to the photocurrent that is integrated during the one time unit. In step 924 all array count values are shifted down one pixel. In step 926 the photocurrent is integrated for one time unit and the counters are decremented by the number of counts corresponding to the photocurrent that is integrated during the one time unit. In step 928 all array count values are shifted to the left one pixel. In step 930 the photocurrent is integrated for one time unit and the counters are decremented by the number of counts corresponding to the photocurrent that is integrated during the one time unit. In step 932 all array count values are shifted to the left one pixel. In step 933 the photocurrent is integrated for one time unit and the counters are decremented by the number of counts corresponding to the photocurrent that is integrated during the one time unit. In step 934 circular shift is disabled (if previously enabled) and data may be read out. The process proceeds to end in step 936. These operations effectively convolve the kernel with the entire image prior to readout.

Employing the integrated digital signal processing of an array in accordance with the principles of the present invention, a variety of functions may be performed within the array itself. For example, in a spectral correlation application, grating-based instruments typically use an imaging array to detect the dispersed spectrum of an image scene. There is a spatial and a spectral dimension to the data gathered by an array in such an application. In accordance with the principles of the present invention, cross correlations to known spectra can be calculated by manipulating shifts, count direction, and integration times, as illustrated in the example of FIG. 9.

In image processing applications, filters for edge detection, smoothing, differentiation, etc., can be performed by an array in accordance with the principles of the present invention using the shifts, adds, and accumulations in manner similar to the process of FIG. 9. In such an application, the scene must remain stationary for the entire time required to implement the filter. Similarly, match filtering may be implemented by developing a filter kernel for cross correlation of objects in the scene (e.g., a person's iris in a personal identity system). The correlated image can then be thresholded by compare logic for detections. The array could readout a raw cross-correlated image, or detections alone. In another aspect of the array, a steering mechanism, which may be external, may be employed to shift accumulated counts in an array in accordance with the principles of the present invention synchronously with the overall motion of an imager and, thereby, permit time domain integration. Similar control of shifting by the output of a sensor inertial measurement unit (IMU) allows an array in accordance with the principles of the present invention to perform image stabilization. Non-uniformity correction may be performed directly on an array in accordance with the principles of the present invention by counting down for a frame period while viewing a flat, extended source. Once the background scene is acquired, the counters are configured to count up, and the scene data is acquired. After a frame period, only signal and noise data will be present; non-uniformity correction will have been achieved. This technique employs a 50% duty cycle for scene and background looks.

An array in accordance with the principles of the present invention may also be employed to form an optical central processing unit. In such an application, an array of light sources, such as LEDs can be imaged onto a digital focal plane array in accordance with the principles of the present invention for computations in the optical domain. The LEDs may be driven, for example, to form the appropriate signals, and the focal plane array can be controlled to add, subtract, multiply and divide, as desired. These operations may be accomplished by controlling the integration time, the count shift position on the array and the ADC counting direction, as described in the discussion related to FIG. 9. In a large array implementation, such a CPU could perform massively parallel operations.

An imaging system in accordance with the principles of the present invention may be configured for operation as a camera, with many applications in various light-sensing ranges. In the visible range, such a camera may take the form of a low-cost still or video camera, a high-end professional-grade video camera, or anything in between.

In the infrared range, an imaging system in accordance with the principles of the present invention may be configured for operation as an infrared camera in industrial sensing, security, or firefighting, for example. Such a camera may also be employed to provide an infrared image of the road ahead of a vehicle. The infrared image may be displayed, for example in a "heads up" display for viewing by the vehicle operator. If the infrared image extends beyond the vehicle's headlights, the vehicle operator may be alerted, for example, to the presence of deer or other hazards on the highway ahead beyond the range of the headlights.

Additionally, an infrared camera in accordance with the principles of the present invention may be configured as a chemical-imaging camera. Such a camera may be employed to capture the chemical composition and distribution of a sample, for example. Such a camera may be employed in military, research, industrial, security, and fire-fighting applications. Such a camera may be employed to enable a biohazard team to quickly determine the composition of spilled material from a safe distance. By coupling a Fourier Transform Infrared spectrometer to a digital focal plane array in accordance with the principles of the present invention, a camera may be employed to produces images that include both spectral and spatial information. Such a combination of FTIR spectrometer with focal plane array in accordance with the principles of the present invention enables the collection spatial, spectral, and intensity information simultaneously, yielding a picture of the chemicals that make up a sample and their distribution within the sample.

The foregoing description of specific embodiments of the invention has been presented for the purposes of illustration and description. It is not intended to be exhaustive or to limit the invention to the precise forms disclosed, and many modifications and variations are possible in light of the above teachings. The embodiments were chosen and described to best explain the principles of the invention and its practical application, and to thereby enable others skilled in the art to best utilize the invention. It is intended that the scope of the invention be limited only by the claims appended hereto.

What is claimed is:

1. An apparatus comprising:
 a two-dimensional array of analog-to-digital converters (ADCs); and
 transfer circuitry operably coupled to the two-dimensional array of ADCs and configured to transfer digital data provided by a first ADC within the two-dimensional array of ADCs to a second ADC within the two-dimensional array of ADCs, wherein the second ADC in the two-dimensional array of ADCs comprises:
 a counter to store at least one of the digital data transferred from the first ADC to the second ADC and other digital data generated by the second ADC.

2. The apparatus of claim 1, wherein the transfer circuitry is further configured to transfer the digital data from the first ADC to any other ADC within the two-dimensional array of ADCs.

3. The apparatus of claim 1, wherein the first ADC is further configured to generate the digital data from an analog signal.

4. The apparatus of claim 3, wherein the first ADC is further configured to vary an integration time associated with acquisition of the analog signal.

5. The apparatus of claim 1, wherein the counter is an up/down counter configured to increment and/or decrement the count based on at least one of the digital data transferred from the first ADC to the second ADC and the other digital data generated by the second ADC.

6. The apparatus of claim 5, wherein the first ADC is further configured to vary an integration time associated with acquisition of an analog signal.

7. The apparatus of claim 6, wherein the transfer circuitry is further configured to perform at least part of at least one of a convolution of the digital data and a cross-correlation of the digital data transferred from the first ADC to the second ADC.

8. The apparatus of claim 1, wherein the transfer circuitry is further configured to perform a digital signal processing operation on the digital data.

9. The apparatus of claim 8, wherein the digital signal processing operation comprises at least one of threshold filtering, high-pass filtering, low-pass filtering, edge-detection filtering, matched filtering, spatial filtering, temporal filtering, and spatio-temporal filtering.

10. The apparatus of claim 1, wherein the transfer circuitry is further configured to perform at least one of a convolution of the digital data and a cross-correlation of the digital data.

11. The apparatus of claim 1, further comprising:
a two-dimensional array of sensors operably coupled to the two-dimensional array of ADCs, the two-dimensional array of sensors including a sensor configured to generate an analog signal and to transfer the analog signal to the first ADC, and
wherein the first ADC is further configured to generate the digital data from the analog signal.

12. The apparatus of claim 11, wherein the transfer circuitry is further configured to transfer the digital data synchronously with motion of an image across the two-dimensional array of sensors.

13. A method of processing digital data, the method comprising:
converting an analog signal to digital data at a first analog-to-digital converter (ADC) in a two-dimensional array of ADCs;
transferring the digital data from the first ADC to a second ADC in the two-dimensional array of ADCs; and
changing a count associated with the second ADC based on the digital data transferred from the first ADC to the second ADC.

14. The method of claim 13, further comprising:
transferring the digital data from the first ADC to a third ADC in the two-dimensional array of ADCs.

15. The method of claim 13, wherein changing the count associated with the second ADC comprises decrementing the count.

16. The method of claim 15, further comprising:
varying an integration time associated with acquisition of the analog signal.

17. The method of claim 16, wherein transferring the digital data from the first ADC to the second ADC and changing the count associated with the second ADC comprise at least part of at least one of a convolution of the digital data and a cross-correlation of the digital data.

18. The method of claim 13, wherein transferring the digital data from the first ADC to the second ADC comprises at least part of performing a digital signal processing operation performed on the digital data.

19. The method of claim 18, wherein the digital signal processing operation comprises at least one of threshold filtering, high-pass filtering, low-pass filtering, edge-detection filtering, matched filtering, spatial filtering, temporal filtering, and spatio-temporal filtering.

20. The method of claim 13, wherein transferring the digital data from the first ADC to the second ADC comprises at least part of at least one of a convolution of the digital data and a cross-correlation of the digital data.

21. The method of claim 13, further comprising:
generating the analog signal at a sensor in a two-dimensional array of sensors; and
transferring the analog signal from the sensor to the first ADC.

22. The method of claim 21, further comprising:
transferring the digital data synchronously with motion of an image across the two-dimensional array of sensors.

23. The method of claim 13, further comprising:
varying an integration time associated with acquisition of the analog signal.

24. An apparatus comprising:
a two-dimensional array of analog-to-digital converters (ADCs), the two-dimensional array of ADCs comprising at least one ADC configured to convert an analog signal to a digital signal, the at least one ADC comprising:
a counter configured to decrement a count responsive to the digital signal.

25. The apparatus of claim 24, wherein each ADC in the two-dimensional array of ADCs is:
(i) configured to provide a respective digital signal, and
(ii) comprises a respective counter to decrement a respective count responsive to the respective digital signal.

26. The apparatus of claim 24, wherein the counter comprises an up/down counter, a ripple counter, or a shift register.

27. The apparatus of claim 24, wherein the counter is further configured to increment or decrement the count responsive to another digital signal provided by another ADC in the two-dimensional array of ADCs.

28. The apparatus of claim 27, further comprising:
a controller operably coupled to the two-dimensional array of ADCs and configured to control whether the counter increments or decrements the count responsive to the other digital signal.

29. The apparatus of claim 24, further comprising:
a two-dimensional array of sensors operably coupled to the two-dimensional array of ADCs, the two-dimensional array of sensors including a first sensor configured to generate the analog signal and to transfer the analog signal to the at least one ADC.

30. The apparatus of claim 29, wherein the number of sensors in the two-dimensional array of sensors equals the number of ADCs in the two-dimensional array of ADCs.

31. A method of digital signal processing, the method comprising:
converting an analog signal to a digital signal with at least one ADC in a two-dimensional array of analog-to-digital converters (ADCs); and
decrementing a count in a counter in the at least one ADC responsive to the digital signal.

32. The method of claim 31, further comprising, at each ADC in the two-dimensional array of ADCs:
converting a respective analog signal to a respective digital signal; and
decrementing a respective count in a respective counter responsive to the respective digital signal.

33. The method of claim 31, further comprising:
incrementing or decrementing the count in the counter responsive to another digital signal provided by another ADC in the two-dimensional array of ADCs.

34. The method of claim 33, further comprising:
controlling whether the counter increments or decrements the count responsive to the other digital signal.

35. The method of claim 31, further comprising:
generating the analog signal at a sensor in a two-dimensional array of sensors; and
transferring the analog signal to the at least one ADC.

* * * * *